United States Patent [19]

Lehmann et al.

[11] Patent Number: 5,306,647
[45] Date of Patent: Apr. 26, 1994

[54] METHOD FOR MANUFACTURING A SOLAR CELL FROM A SUBSTRATE WAFER

[75] Inventors: Volker Lehmann, Munich; Reinhard Stengl, Stadtbergen; Hermann Wendt, Neukeferloh; Wolfgang Hoenlein, Unterhaching; Josef Willer, Riemerling, all of Fed. Rep. of Germany

[73] Assignee: Siemens Aktiengesellschaft, Munich, Fed. Rep. of Germany

[21] Appl. No.: 998,611

[22] Filed: Dec. 30, 1992

[30] Foreign Application Priority Data

Jan. 29, 1992 [DE] Fed. Rep. of Germany ....... 4202455

[51] Int. Cl.$^5$ ............................................. H01L 31/18
[52] U.S. Cl. ...................................... 437/2; 136/255; 136/256; 136/261; 437/944; 437/974; 437/981; 204/129.3; 204/129.55; 257/466
[58] Field of Search .................... 437/2, 172, 173, 203, 437/225, 944, 974, 981; 204/129.3, 129.55; 136/255, 256, 261; 257/466

[56] References Cited

U.S. PATENT DOCUMENTS

| | | | |
|---|---|---|---|
| 3,969,746 | 7/1976 | Kendall et al. | 136/255 |
| 4,137,123 | 1/1979 | Bailey et al. | 156/647 |
| 4,255,208 | 3/1981 | Deutscher et al. | 437/3 |
| 4,303,463 | 12/1981 | Cook | 156/603 |
| 4,338,481 | 7/1982 | Mandelkorn | 136/255 |
| 4,409,423 | 10/1983 | Holt | 136/255 |
| 4,425,408 | 1/1984 | Levine et al. | 428/403 |
| 4,447,289 | 5/1984 | Geissler et al. | 156/608 |
| 4,461,671 | 7/1984 | Seifert et al. | 156/607 |
| 4,717,630 | 1/1988 | Hamakawa et al. | 428/612 |
| 4,727,047 | 2/1988 | Bozler et al. | 437/89 |
| 4,824,489 | 4/1989 | Cogan et al. | 136/256 |
| 5,081,049 | 1/1992 | Green et al. | 437/2 |

FOREIGN PATENT DOCUMENTS 0296348 12/1988 European Pat. Off. .
3122771A1 5/1982 Fed. Rep. of Germany .
3225118 1/1983 Fed. Rep. of Germany .

OTHER PUBLICATIONS

Branebjerg et al., "Dopant Selective HF Anodic Etching of Silicon For The Realization of Low-Doped Monocrystalline Silicon Microstructures", Proceedings of IEEE on *Micro Electro Mechanical Systems*, Jan. 30, 1991-Feb. 2, 1991, pp. 221-226.

Werner, "Solarzellen mit Silizium aus der Flussigphasenepitaxie Devices", 1991, pp. 1076 and 1077.

*Primary Examiner*—Aaron Weisstuch
*Attorney, Agent, or Firm*—Hill, Steadman and Simpson

[57] ABSTRACT

A self-supporting layer of n-doped monocrystalline silicon is stripped from a substrate wafer of n-doped, monocrystalline silicon by electrochemical etching for manufacturing a solar cell. Holes are formed in the substrate wafer by electrochemical etching, particularly in a fluoride-containing, acidic electrolyte wherein the substrate wafer is connected as an anode. When a depth of the holes that essentially corresponds to the thickness of the self-supporting layer is reached, the process parameters of the etching are modified such that the self-supporting layer is stripped as a consequence of the holes growing together. The solar cell is manufactured from the self-supporting layer, and the method can be applied repeatedly on the same substrate wafer for stripping a plurality of self-supporting layers.

20 Claims, 3 Drawing Sheets

METHOD FOR MANUFACTURING A SOLAR CELL FROM A SUBSTRATE WAFER

BACKGROUND OF THE INVENTION

Substrate wafers of monocrystalline silicon are used in the manufacture of solar cells. Monocrystalline solar cells produced therefrom are more efficient and have more long-term stability as compared to non-crystalline solar cells. However, monocrystalline solar cells are expensive to manufacture since they require using monocrystalline silicon.

An ideal thickness of a solar cell of monocrystalline silicon is approximately 0.06 mm. Substrate wafers from which solar cells are manufactured can be cut to a minimum thickness of about 0.3 mm. As a result, these manufactured solar cells are several times thicker than required for the functioning of the solar cell. Furthermore, the excess monocrystalline silicon material leads to an increase in the resistance and thus deteriorates the properties of the solar cell. See, for example, *Phys. Bl.*, Vol. 47 (1991) pages 1067–1075.

SUMMARY OF THE INVENTION

It is, therefore, an object of the present invention to provide a method for manufacturing a solar cell from a substrate wafer such that the material of the wafer is more efficiently utilized.

To this end, a self-supporting layer of n-doped, monocrystalline silicon is stripped by electrochemical etching from a substrate wafer of n-doped, monocrystalline silicon by forming holes in a first surface of the substrate wafer by electrochemical etching. After a depth of the holes that essentially corresponds to the thickness of the self-supporting layer has been reached, process parameters of the etching are modified such that the cross section of the holes enlarges and such that the self-supporting layer is stripped as a result of the holes growing together. At least one pn-junction is produced in the self-supporting layer, and a self-supporting layer is provided with contacts such that the pn-junction can be connected as a solar cell.

Since the substrate wafer is connected as an anode in the electrochemical etching, minority charge carriers in the n-doped silicon move to the surface in contact with the electrolyte. A space charge zone is formed at this surface. Since the field strength in the region of depressions in the surface is greater than outside this region, the minority charge carriers principally move toward these points. A structuring of the surface thereby arises.

More and more minority charge carriers move to an initially small irregularity because of the increasing field strength, and the etching process is even stronger at this location as the initially small irregularity becomes deeper due to the etching. These holes grow in the crystallographic <100> direction. It is, therefore, advantageous to employ a substrate wafer having a <100> orientation since the holes then grow perpendicularly relative to the first surface. This, in turn, leads to a uniform structuring of the substrate wafer.

The electrochemical etching of n-doped silicon for manufacturing holes or trenches is known, for example, from European Patent 0 296 348 A1, wherein trenches, particularly for DRAM cells, are manufactured in this way. The possibility of applying this etching method for stripping self-supporting layers, however, is not taken into consideration in this known method.

The etching process is dependent on the current density in the substrate wafer and on the concentration in the electrolyte. The etching process is increased by elevating the current density in the electrolyte or by reducing the concentration in the electrolyte.

The method of the present invention uses this fact to increase the etching erosion such that the cross section of the hole grows when a depth of the holes that essentially corresponds to the thickness of the self-supporting layer is achieved. Since the etching process only occurs in the lower region of the holes, the cross section of the holes in the upper region, i.e. in the proximity of the first surface, thereby remains unaltered. In the lower region, however, the holes grow both in width as well as in depth. The electrochemical etching is continued until neighboring holes grow together and the self-supporting layer is stripped off.

The self-supporting layer, like the substrate wafer, is composed of n-doped, monocrystalline silicon. The self-supporting layer is now used for manufacturing the solar cell.

The thickness of the self-supporting layer can be set by the depth of the holes. By the present invention, a self-supporting layer having a thickness of at least 10 $\mu$m can be set to any desired value of the thickness. The self-supporting can be easily manufactured to a thickness of approximately 60 $\mu$m. The thickness of the solar cell can, therefore, be set to the theoretical value for the ideal thickness.

Solar cells manufactured according to the method of the present invention can, therefore, be realized with a reduced bulk resistance. The bulk resistance of a solar cell is critical for its efficiency. The efficiency of the solar cell, therefore, varies with its bulk resistance. Solar cells having greatly improved efficiency can, therefore, be manufactured with the method of the present invention.

Furthermore, solar cells having a lower thickness which can be manufactured using the present invention are less sensitive to damage due to alpha radiation. Radiation damage due to alpha radiation represents a problem when using solar cells in the power supply of satellites.

Further, the surface of the self-supporting layer is rough due to the etching process and thus yields a minimization of optical reflection without additional process steps.

The current density in the substrate wafer can be influenced in an especially simple manner by illuminating a second surface of the substrate wafer lying opposite the first surface. In this case, the stripping of the self-supporting layer is achieved by increasing the illumination.

It is, therefore, an object of the present invention to provide the first surface of the substrate wafer with a surface topology before the formation of the holes. In this way, the first surface is purposely provided with depressions at which the etching process begins in the electrochemical etching. When the first surface is provided with a surface topology of regularly arranged depressions, the stripped, self-supporting layer has an essentially constant thickness. In this case, namely, the spacing of the holes is essentially identical such that the quantity of material between neighboring holes that must be etched off for stripping the self-supporting layer by increasing the etching process is essentially the same. All holes can then essentially grow together simultaneously.

The generation of the surface topology can be omitted for applications wherein a constant thickness of the self-supporting layer is of no concern. This leads to a simplification of the process in this case.

The surface topology is thereby produced, for example, after producing a photoresist mask on the first surface and subsequent alkaline etching of the first surface. Conventional optical photolithography may be used for producing the photoresist mask.

A further object of the invention is to produce the surface topology by light-induced, electrochemical etching in the same electrolyte wherein the holes are subsequently etched. An illumination pattern is thereby produced on the first surface upon employment of a light source having a wavelength less than 1100 nm. The current density in the substrate wafer is set such that an anodic minority carrier current that effects an etching erosion of the first surface locally flows across the substrate wafer only at illuminated locations of the illumination pattern. This procedure has the advantage that no separate etching technique need be applied for producing the surface topology.

It is a further object of the present invention to strip at least one further, self-supporting layer from the remaining substrate wafer by electrochemical etching after the stripping of the self-supporting layer. This method can be repeated for stripping further, self-supporting layers until the mechanical stability of the remaining substrate wafer is no longer adequate.

For example, ten stripped, self-supporting each having a thickness of 30 μm can be produced from a substrate wafer that is manufactured to a thickness of 500 μm by sawing, as is used in traditional solar cell manufacture. Each of the self-supporting layers is the raw material for the further solar cell manufacture.

Since the self-supporting layer is the initial material for the solar cell manufacture using the method of the invention, whereas the sawn substrate wafer is the initial material for the solar cell manufacture in traditional methods, the yield per sawn substrate wafer in the method of the present invention amounts to a multiple of the yield in the traditional method in the manufacture of solar cells which is ten times the yield in the cited example.

Since the material of the sawn substrate wafer can be utilized far better by the method of the invention than in the traditional methods, the cost of material for the solar cell formed in every single self-supporting layer drops. This advantage is even more pronounced when one proceeds on the basis of thicker, sawn substrate wafers. Given employment of a sawn substrate wafer having a thickness of, for example, 1 mm, at least twenty-five self-supporting layers can be stripped off. A share of 4% of the cost of the sawn substrate wafer then derives per self-supporting layer. As previously stated, the solar cells manufactured according to the present invention have improved efficiency beyond this because of their lower thickness and their lower bulk resistance.

Additional features and advantages of the present invention are described, and will be apparent from, the detail description of the presently preferred embodiments and from the drawings.

DETAILED DESCRIPTION OF THE PRESENTLY PREFERRED EMBODIMENTS

Figure 1:
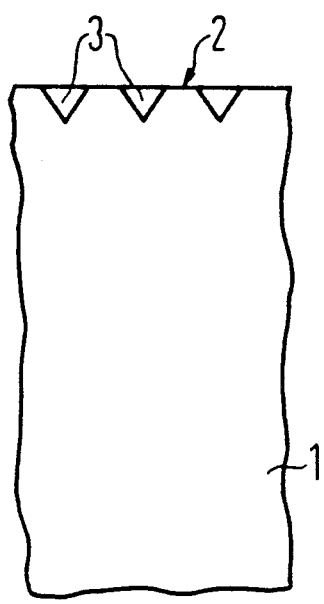
FIG. 1 illustrates a substrate wafer having a surface topology.
Figure 2:
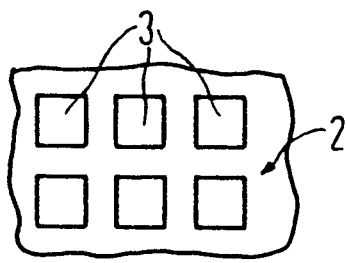
FIG. 2 illustrates a plan view of the substrate wafer shown in FIG. 1.

A substrate wafer 1 of n-doped, monocrystalline silicon having, for example, <100> orientation is provided with a surface topology having a depression 3 in a first surface 2 as shown in FIG. 1. The substrate wafer 1 is produced with a thickness of, for example, 0.5 mm using conventional sawing techniques. The depressions 3 are regularly arranged in the first surface 2 as can be seen in the plan view in FIG. 2.

The depressions 3 are produced, for example, after forming a photoresist mask on the first surface of the substrate wafer with the assistance of conventional photolithograhy and subsequent alkaline etching. Alternatively, the surface topology can be formed by light-induced electrochemical etching.

After producing the depressions 3, the first surface 2 is brought into contact with an electrolyte. The electrolyte contains fluoride and is acidic. The electrolyte further includes a hydrofluoric acid concentration of between one percent and fifty percent and, in a preferred embodiment, contains approximately six percent.

An oxidation agent, for example hydrogen peroxide, can be added to the electrolyte in order to suppress the development of hydrogen bubbles on the first surface 2 of the substrate wafer 1. A voltage of, for example, 3 volts can be applied between the substrate wafer 1 and the electrolyte. The substrate wafer 1 that, for example, has a conductivity of 5 ohm.cm is thereby connected as an anode. The substrate wafer 1 is illuminated proceeding from a second surface lying opposite the first surface 2. A current density of 10 mA/cm$^2$ is set in the substrate wafer 1 from the illumination.

Figure 3:
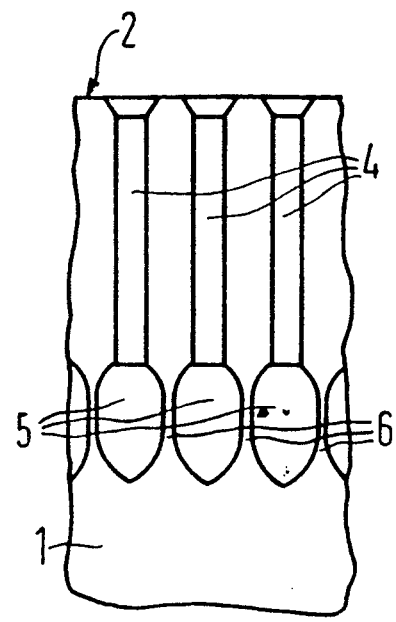
FIG. 3 illustrates stripping of a self-supporting layer from the substrate wafer as shown in FIG. 1.

Holes 4 are etched in the first surface 2 with the process parameters as shown in FIG. 3. That is, the holes 4 proceed perpendicularly relative to the first surface 2. Furthermore, the holes 4 have a constant cross-section parallel to the first surface 2 over their depth. The cross section of the holes 4 is dependent on the current density in the substrate wafer 1 and on the fluoride concentration of the electrolyte.

After an etching time of approximately sixty minutes, a depth of approximately 30 μm for the holes 4 is achieved with the aforementioned process parameters. At this depth, the current density in the substrate wafer is raised to, for example, 30 mA/cm$^2$. The voltage between the substrate wafer 1 and the electrolyte is thereby set to 2 Volts. The substrate wafer 1 continues to be illuminated proceeding from the second surface.

Due to these modified process parameters, cave-shaped expanded portions 5 arise at the floor of the holes 4 because the current density has increased. Neighboring cave-shaped expanded portions 5 are separated by webs 6. The width of the webs 6 decreases during the etching.

Figure 4:
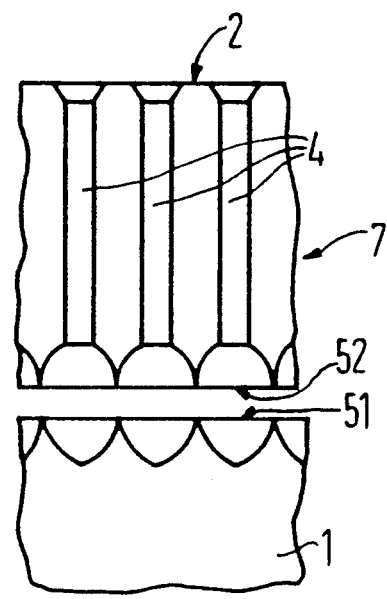
FIG. 4 illustrates further stripping of a self-supporting layer from the substrate wafer of FIGS. 1 and 3.

After approximately ten minutes, the webs 6 are etched away with the recited process parameters and the cave-shaped expanded portions 5 and, thus, the holes 4 have grown together as shown in FIG. 4. A self-supporting layer 7 is thereby stripped from the rest of the substrate wafer 1. The self-supporting layer 7 comprises the first surface 2 and the holes 4. At that side facing away from the first surface 2, the self-supporting layer 7 has a structured surface 52 since the cave-shaped expanded portions 5 of the holes 4 have grown together.

The remainder of the substrate wafer 1 likewise comprises a structured surface 51 resulting from the cave-shaped expanded portions 5 growing together. From this creation, the structured surface 51 is, therefore, provided with a surface topology. This surface topology corresponds to the arrangement of the depressions 3 at the beginning of the processing of the substrate wafer 1 as shown in FIG. 1. Proceeding on the basis of the substrate wafer 1 having the structured surface 51, the method of the present invention continues as long as allowed by the mechanical stability of the remainder of the substrate wafer 1. The limit lies at a thickness of 100-200 μm for the remainder of the substrate wafer 1.

The thickness of the self-supporting layer 7 is defined by the depth of the holes 4 since the holes 4 are regularly distributed over the first surface 2. This regular distribution of the holes 4 leads to the fact that the webs 6 are of essentially the same width and the cave-shaped expanded portions 5, therefore, grow together essentially simultaneously. A constant thickness of the self-supporting layer 7 results.

Since the structured surface 51 of the remainder of the substrate wafer 1 comprises a surface topology corresponding to the depressions 3, the thickness of further, self-supporting layers that are stripped from the remainder of the substrate wafer 1 may always be the same, given identical process parameters.

Figure 5:
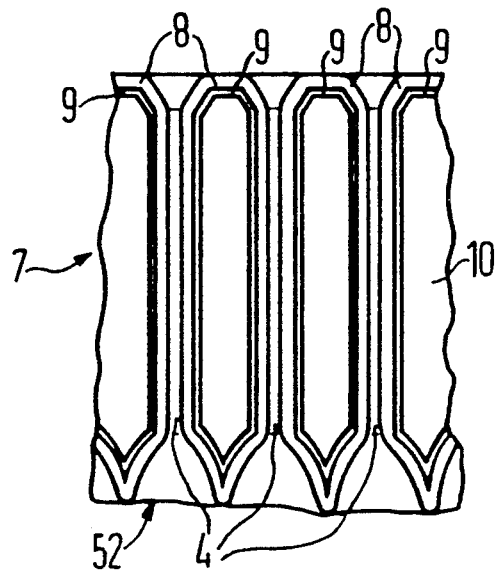
FIG. 5 illustrates a first step in a method of manufacturing of a solar cell of the present invention.

A solar cell is manufactured by a method of the present invention from the self-supporting 7. To this end, the entire surface of the self-supporting layer 7 has a layer 8 of boro-phosphorus-silicate glass (BPSG) applied onto the self-supporting layer 7. The layer 8 also covers the surfaces of the holes 4 as shown in FIG. 5.

Due to drive-out of boron from the layer 8 of BPSG, a p+-doped region 9 that is arranged at the entire surface of the self-supporting layer 7 is formed. The doping in the p+-doped region 9 is set, for example, to $10^{19}/cm^3$. An n-doped region 10 remains in the interior of the self-supporting layer 7.

Figure 7:
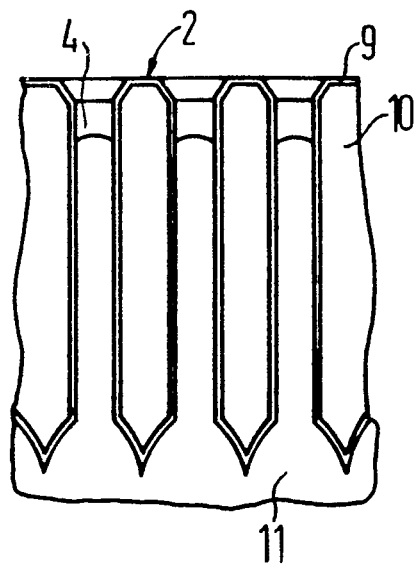
FIG. 7 illustrates a third step in the method of manufacturing of the solar cell of the present invention.
Figure 6:
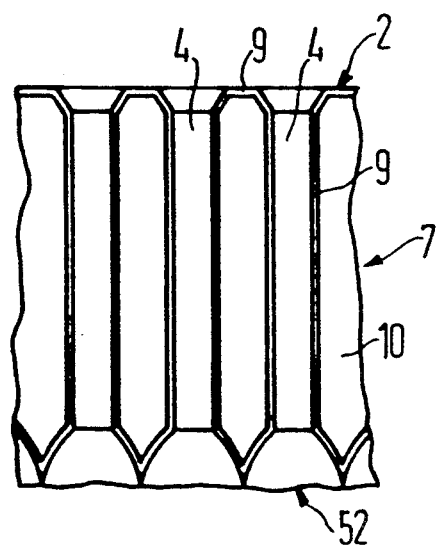
FIG. 6 illustrates a second step in the method of manufacturing of the solar cell of the present invention.

Subsequently, the layer 8 of BPSG is removed as shown in FIG. 6, and a resist layer 11 is applied as shown in FIG. 7. The resist layer 11 is applied such that it completely covers the structured surface 52, whereas the p+-doped region 9 remains uncovered in the region of the first surface 2 and the upper part of the holes 4 neighboring the first surface 2 as shown in FIG. 7.

Figure 8:
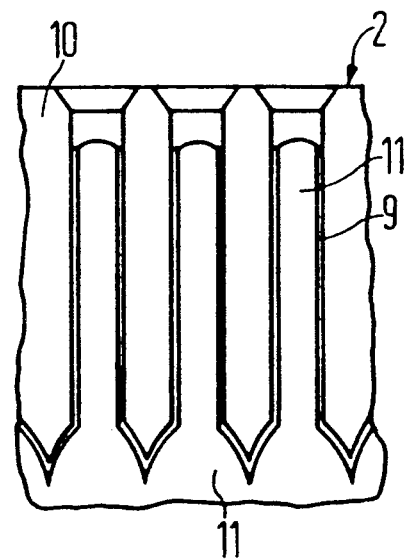
FIG. 8 illustrates a fourth step in the method of manufacturing of the solar cell of the present invention.

In an isotropic etching process with, for example, a HF and $HNO_3$ mixture, the exposed part of the p+-doped region 9 outside the resist layer 11 is etched off such that the n-doped region 10 is uncovered at the first surface 2 and at the upper part of the holes 4 as shown in FIG. 8.

Figure 9:
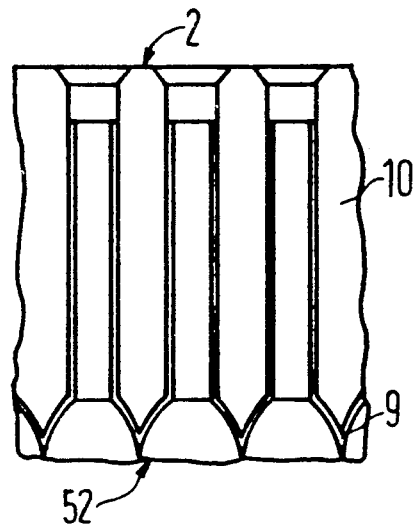
FIG. 9 illustrates a fifth step in the method of manufacturing of the solar cell of the present invention.
Figure 10:
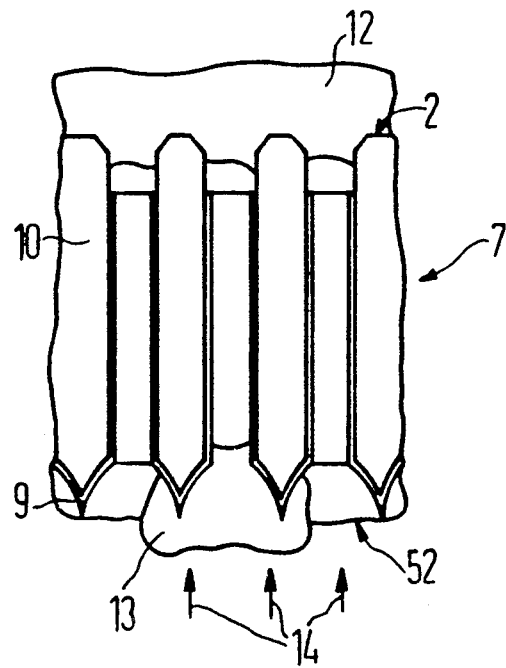
FIG. 10 illustrates a sixth step in the method of the manufacturing of the solar cell of the present invention.

After removal of the resist layer 11 as shown in FIG. 9, a first contact 12 contacting the n-doped region 10 and a second contact 13 contacting the p+-doped region 9 are produced as shown in FIG. 10. The first contact 12 and the second contact 13 are ohmic contacts that, for example, are defined by a conductive silver paste.

The first contact 12 for the connection of the n-doped region 10 is applied onto the first surface 2 as a continuous contact. The second contact 13 is applied onto the structured surface 52 in structured form. The second contact 13 is thereby structured in order to allow the light incidence indicated by arrows 14 ensues into the self-supporting layer 7 proceeding from the structured surface 52. In order to improve the conductivity, a conductive layer of, for example, indium tin oxide (ITO) can be applied under the first contact 12 and under the second contact 13.

The structured surface 52 through which the light incidence into the finished solar cell ensues arises in the method of the invention by stripping the self-supporting layer 7. This structured surface 52 has extremely small light reflection, which is an advantageous result for the solar cell.

The efficiency of the solar cell can be improved further based on surface passivation by applying a layer of thermal $SiO_2$ after the removal of the layer 8 of BPSG. Furthermore, the efficiency can be improved in that the uncovered parts of the n-doped region 10 are provided with a higher n+-doping by diffusion or implantation after uncovering the n-doped region 10 by etching off the p+-doped region 9 and before removal of the resist layer 11. For example, a dopant concentration of $10^{19}/cm^3$ is recommended.

It should be understood that various changes and modifications to the presently preferred embodiments described herein will be apparent to those skilled in the art. Such changes and modifications may be made without departing from the spirit and scope of the present invention and without diminishing its attendant advantages. It is, therefore, intended that such changes and modifications be covered by the appended claims.

We claim:

1. A method for manufacturing a solar cell from a substrate wafer, comprising the steps of:
   (a) stripping a self-supporting layer of n-doped, monocrystalline silicon by electrochemical etching from a substrate wafer of n-doped, monocrystalline silicon, said stripping comprising the steps of —:
      (1) forming holes in a first surface of the substrate wafer by electrochemical etching;
      (2) modifying the process parameters of the etching when a depth of the holes which essentially corresponds to thickness of the self-supporting layer has been reached such that the cross section of the holes is enlarged and further such that the self-supporting layer is stripped as a result of the holes growing together;
   (b) producing at least one pn-junction in the self-supporting layer; and
   (c) providing the self-supporting with contacts such that the pn-junction may be connected as a solar cell.

2. The method of claim 1 further comprising the steps of:
   implementing said electrochemical etching in a fluoride-containing, acidic electrolyte with which the first surface is in contact; and applying an electrical voltage between the substrate wafer and the electrolyte such that the substrate wafer is connected as an anode and such that a predetermined current density that influences the etching erosion flows in the substrate wafer.

3. The method of claim 1 wherein the holes are formed perpendicular to the first surface.

4. The method of claim 1 wherein the substrate wafer is a <100> oriented wafer.

5. The method of claim 1 further comprising the step of:
illuminating the substrate wafer through a second surface lying opposite the first surface in order to set the predetermined current density in the substrate wafer.

6. The method of claim 1 further comprising the step of:
generating a surface topology defining the arrangement of the holes at the first surface of the substrate wafer before the formation of the holes.

7. The method of claim 6 wherein the surface topology is composed of regularly arranged depressions on the surface.

8. The method of claim 6 further comprising the steps of:
producing the surface topology by forming a photoresist mask on the first surface of the substrate wafer; and
alkaline etching of the first surface of the substrate wafer.

9. The method of claim 6 further comprising the steps of:
producing the surface topology by electrochemical etching in the electrolyte by producing an illumination pattern on the first surface using a light source having a wavelength less than 100 nm; and
setting the current density in the substrate wafer such that an anodic minority carrier current that effects an etching erosion of the first surface locally flows over the substrate wafer only at illuminated locations of the illumination pattern.

10. The method of claim 1 wherein the electrolyte contains between one percent and fifty percent hydrofluoric acid.

11. The method of claim 10 wherein the electrolyte additionally contains an oxidation agent.

12. The method of claim 1 further comprising the step of:
increasing the current density in the substrate wafer for stripping the self-supporting layer.

13. The method of claim 1 further comprising the step of:
reducing the concentration of the fluoride in the electrolyte for stripping the self-supporting layer.

14. The method of claim 1 further comprising the steps of:
stripping at least one further, self-supporting layer from the substrate wafer by electrochemical etching after the stripping of the self-supporting layer;
producing at least one pn-junction in the further self-supporting layer; and
providing the further self-supporting layer with contacts such that the pn-junction can be connected as a solar cell.

15. The method of claim 1 further comprising the steps of:
coating the self-supporting layer with a layer of boro-phosphorus-silicate glass to produce the pn-junction in the self-supporting layer; and
diffusing boron from the layer of boro-phosphorus-silicate glass to produce a $p^+$-doped region in the self-supporting layer.

16. The method of claim 15 wherein the layer of boro-phosphorus-silicate glass covers the entire surface of the self-supporting layer and the $p^+$-doped region covers the entire surface of the self-supporting layer and the self-supporting layer further comprises a n-doped region in its interior.

17. The method of claim 16 further comprising the steps of:
providing the self-supporting layer with a resist layer after the removal of the layer of boro-phosphorus-silicate glass, said resist layer covering all surfaces of the $p^+$-doped region except the first surface of the self-supporting layer and an upper part of the holes in a region of the first surface; and
selectively etching the part of the $p^+$-doped region not covered by the resist layer such that the n-doped region is uncovered at the first surface.

18. The method of claim 17 further comprising the steps of:
providing the $p^+$-doped region with a passivation layer of thermal silicon dioxide before application of the resist layer.

19. The method of claim 17 wherein the uncovered parts of the n-doped region are provided with an $n^+$-doping in the region of the first surface.

20. The method of claim 17 further comprising the steps of:
applying at least one contact for the connection of the n-doped region onto the first surface after removal of the resist layer; and
applying at least one contact for the connection of the $p^+$-doped region onto a structured surface lying opposite the first surface, said two contacts being applied such that light can enter into the self-supporting layer through the structured surface.

* * * * *